(12) United States Patent
Takemura et al.

(10) Patent No.: US 9,484,519 B2
(45) Date of Patent: Nov. 1, 2016

(54) PIEZOELECTRIC/ELECTROSTRICTIVE ELEMENT

(71) Applicant: NGK Insulators, Ltd., Nagoya-Shi (JP)

(72) Inventors: Shinya Takemura, Komaki (JP); Takashi Ebigase, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 283 days.

(21) Appl. No.: 14/186,487

(22) Filed: Feb. 21, 2014

(65) Prior Publication Data

US 2014/0292157 A1     Oct. 2, 2014

(30) Foreign Application Priority Data

Mar. 29, 2013    (JP) ................................ 2013-070896

(51) Int. Cl.
| | |
|---|---|
| *H01L 41/047* | (2006.01) |
| *B41J 2/14* | (2006.01) |
| *B41J 2/16* | (2006.01) |
| *H01L 41/08* | (2006.01) |
| *H01L 41/09* | (2006.01) |

(52) U.S. Cl.
CPC .......... *H01L 41/047* (2013.01); *B41J 2/14233* (2013.01); *B41J 2/161* (2013.01); *B41J 2/1629* (2013.01); *B41J 2/1631* (2013.01); *B41J 2/1645* (2013.01); *H01L 41/0805* (2013.01); *H01L 41/0973* (2013.01)

(58) Field of Classification Search
CPC ............. H01L 41/0805; H01L 41/047; H01L 41/0973
USPC ........................................ 310/321, 324, 365
See application file for complete search history.

(56) References Cited

U.S. PATENT DOCUMENTS

| | | | |
|---|---|---|---|
| 2005/0012569 A1* | 1/2005 | Sasaki | ...................... H03H 3/04 333/189 |
| 2011/0050809 A1 | 3/2011 | Takahashi | |
| 2012/0218060 A1 | 8/2012 | Burak et al. | |

FOREIGN PATENT DOCUMENTS

| | | |
|---|---|---|
| DE | 10 2012 213 892 A1 | 2/2013 |
| EP | 1 170 862 A2 | 1/2002 |
| EP | 1 671 794 A1 | 6/2006 |
| JP | 06-237026 A1 | 8/1994 |
| JP | 2000-040936 A1 | 2/2000 |

OTHER PUBLICATIONS

Extended European Search Report (Application No. 14159738.5) dated Jun. 27, 2014.

* cited by examiner

*Primary Examiner* — Derek Rosenau
(74) *Attorney, Agent, or Firm* — Burr & Brown, PLLC (57) ABSTRACT

A piezoelectric/electrostrictive element has a piezoelectric body, a first electrode, a second electrode and a glass layer. The piezoelectric body is formed in a thin film-shape. The piezoelectric body has a first main surface and a second main surface. The first electrode is disposed on the first main surface of the piezoelectric body. The first electrode has an electrode side surface configured to be connected with the first main surface. The second electrode is disposed on the second main surface of the piezoelectric body. The glass layer is continuously formed on the first main surface and the electrode side surface. The glass layer containing glass as a principal constituent. The glass layer is isolated from the side surface of the piezoelectric body.

6 Claims, 9 Drawing Sheets

PIEZOELECTRIC/ELECTROSTRICTIVE ELEMENT

CROSS-REFERENCE TO RELATED APPLICATIONS

This application claims priority under 35 U.S.C. §119 to Japanese Patent Application No. 2013-70896, filed on Mar. 29, 2013. The entire disclosure of Japanese Patent Application No. 2013-70896 is hereby incorporated herein by reference.

BACKGROUND OF THE INVENTION

1. Field of the Invention

The technology disclosed herein relates to a piezoelectric/electrostrictive element that has an electrode disposed on a piezoelectric body.

BACKGROUND INFORMATION

Typically, various methods have been proposed for the purpose of inhibiting peeling of an electrode that is formed on a piezoelectric body.

2. Description of Related Art

For example, Japanese Patent Application Laid-Open No. 06-237026 discloses a method of interposing a glass layer between an electrode and a piezoelectric body. Japanese Patent. Application Laid-Open No. 2000-40936 discloses a method of sealing an end portion of the electrode with a resin layer.

SUMMARY OF THE INVENTION

However, the methods above are associated with the problem that the displacement of the piezoelectric body is reduced due to the rigidity of the resin layer or the glass layer.

In light of the circumstances described above, the object of the technology disclosed herein is to provide a piezoelectric/electrostrictive element that enables inhibition of a reduction in the displacement of the piezoelectric body while inhibiting peeling of the electrode.

A piezoelectric/electrostrictive element has a piezoelectric body a first electrode, a second electrode and a glass layer. The piezoelectric body is formed in a thin film-shape. The piezoelectric body has a first main surface and a second main surface. The first electrode is disposed on the first main surface of the piezoelectric body. The first electrode has an electrode side surface configured to be connected with the first main surface. The second electrode is disposed on the second main surface of the piezoelectric body. The glass layer is continuously formed on the first main surface and the electrode side surface. The glass layer containing glass as a principal constituent. The glass layer is isolated from the side surface of the piezoelectric body.

The technology disclosed herein provides a piezoelectric/electrostrictive element that enables inhibition of a reduction in the displacement of the piezoelectric body while inhibiting peeling of the electrode.

BRIEF DESCRIPTION OF DRAWINGS

Referring now to the attached drawings which form a part of this original disclosure.

DETAILED DESCRIPTION OF THE INVENTION

An actuator for use in an inkjet head configured to apply the piezoelectric/electrostrictive element will be described below making reference to the figures. The piezoelectric/electrostrictive element can be applied to various uses such as an oscillation circuit, various types of sensors or an injector actuator.

The same or similar portions disclosed in the following figures are denoted by the same or similar reference numerals. However, the figures are merely schematic, and the ratios of the respective dimensions or the like may differ from the actual values. Therefore, the actual dimensions or the like should be determined by making reference to the following description. In addition, it is naturally the case that portions are included that exhibit differences in relation to ratios or in relation to the relationship between mutual dimensions in different figures.

Configuration of Actuator 100

Figure 1:
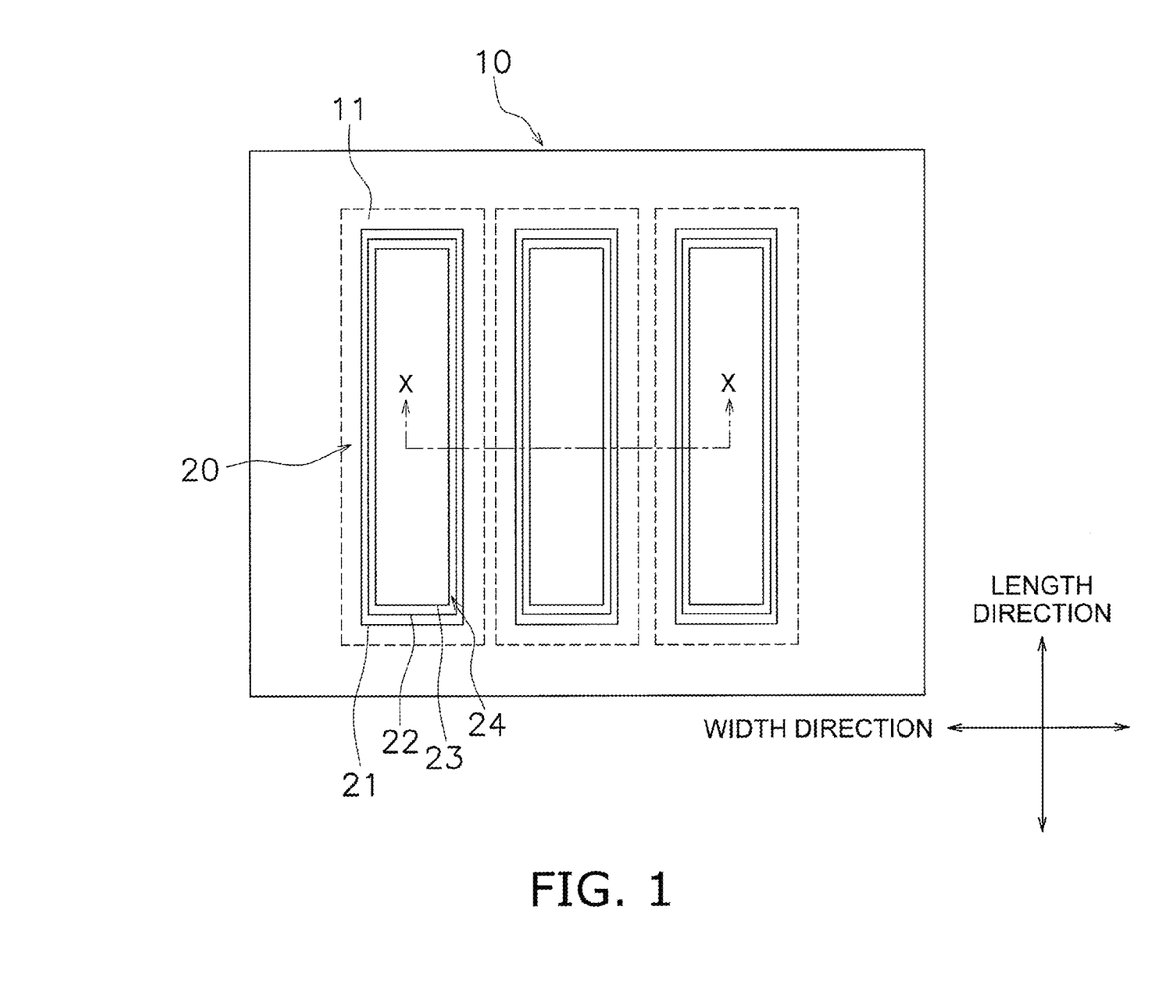
FIG. 1 is a plan view illustrating a configuration of an actuator.
Figure 2:
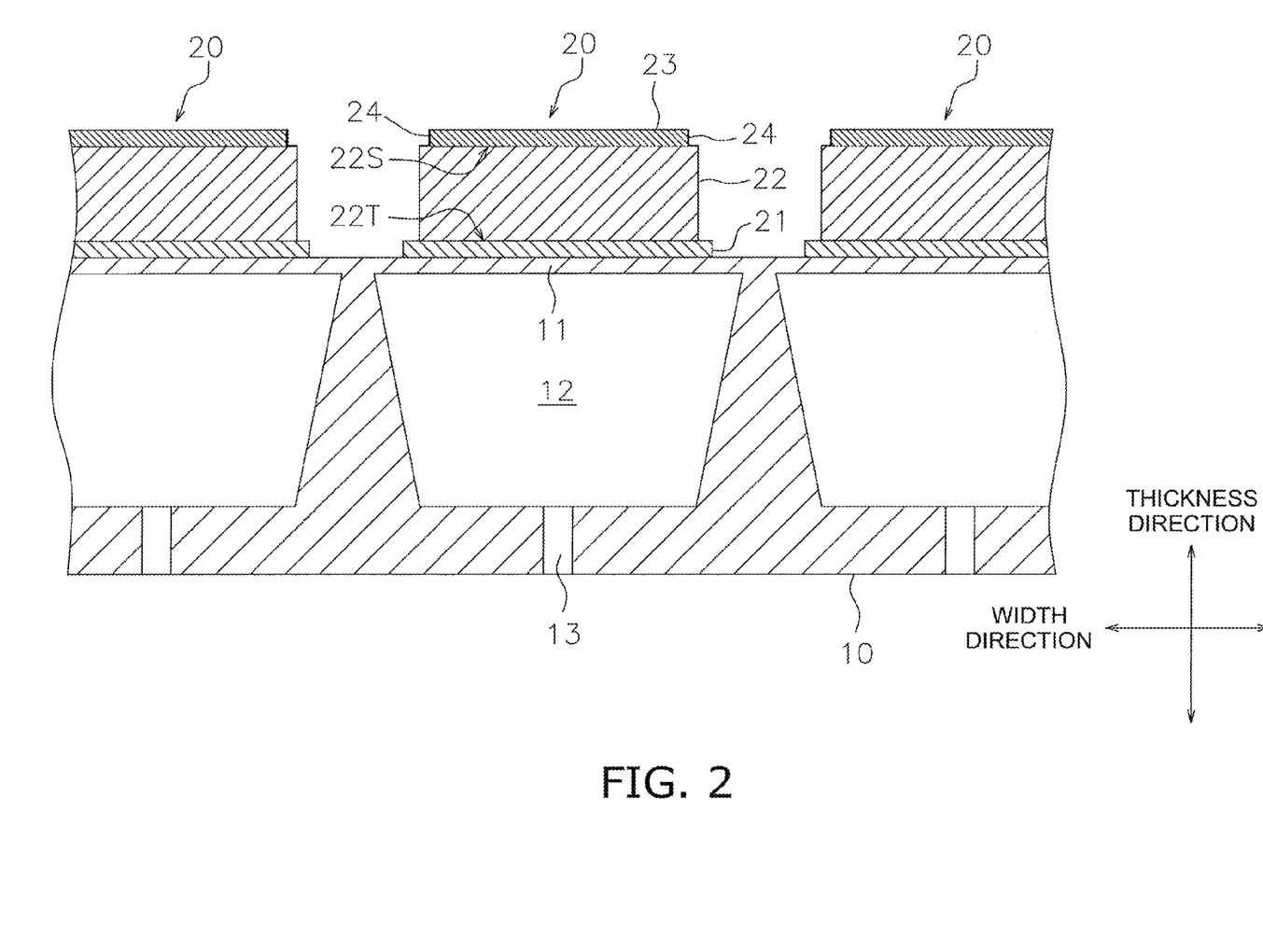
FIG. 2 is a sectional view along the line X-X in FIG. 1.
Figure 3:
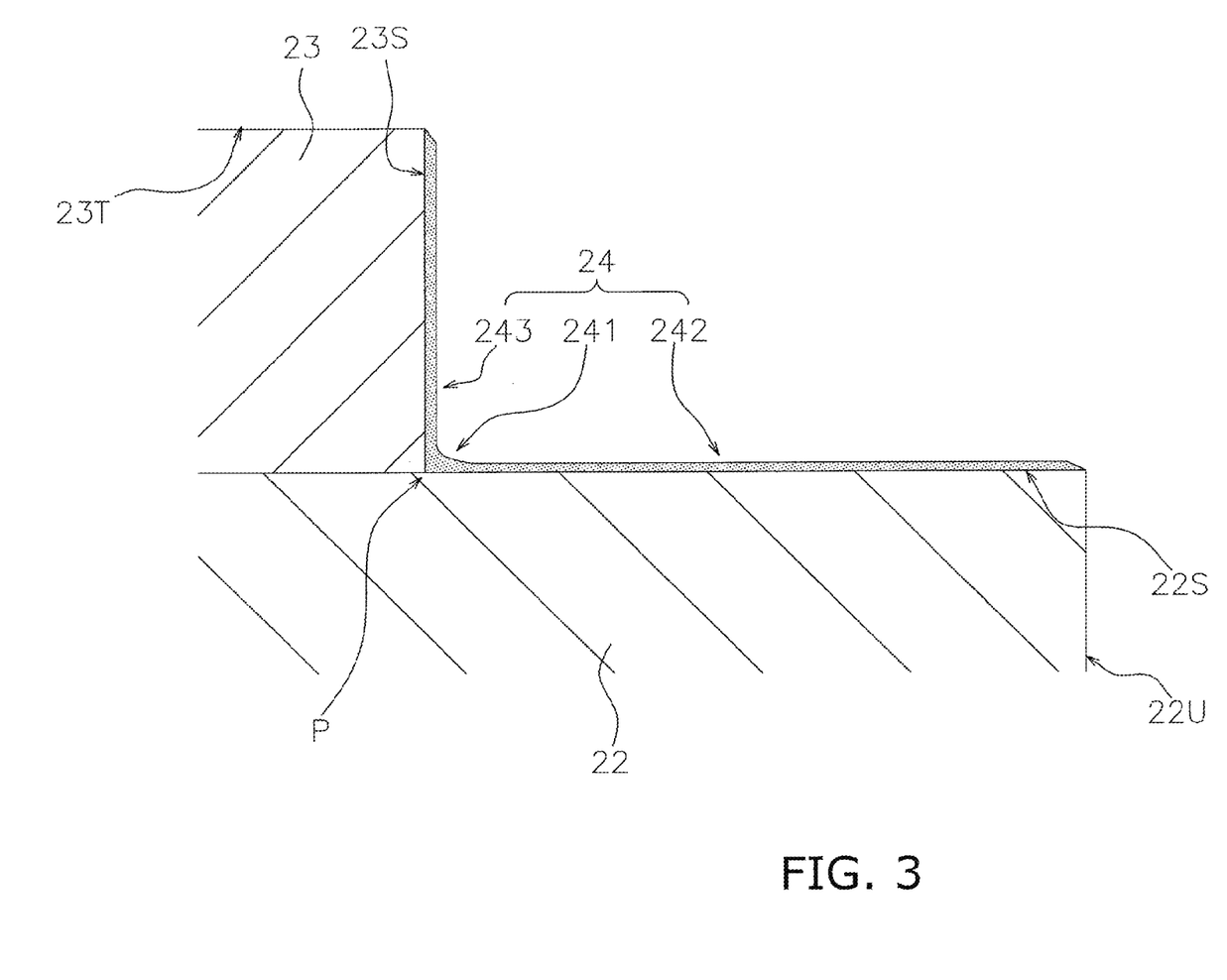
FIG. 3 is an enlargement of a portion of FIG. 2.

The configuration of the actuator 100 will be described making reference to the figures. FIG. 1 is a plan view illustrating a configuration of the actuator 100. FIG. 2 is a sectional view along the line X-X in FIG. 1. FIG. 3 is an enlargement of a portion of FIG. 2. In the following description, as illustrated in FIG. 1, the direction in which the piezoelectric/electrostrictive element 20 extends is termed the "length direction", and the direction that is orthogonal to the length direction is termed the "width direction". As illustrated in FIG. 2, the direction that is orthogonal to the length direction and the width direction is termed the "thickness direction".

The actuator 100 includes a substrate 10 and a plurality of piezoelectric/electrostrictive elements 20.

1. Substrate 10

The substrate 10 is a plate-shaped fired body. The substrate 10 is configured from an insulating material. The insulating material used to configure the substrate 10 includes for example, stabilized zirconium oxide, aluminum oxide, magnesium oxide, mullite, aluminum nitride and silicon nitride, or the like.

The insulating material that configures the substrate 10 is not limited to a ceramic material and may be configured by a glass material, a resin material, or the like. Furthermore, the particles that configure the substrate 10 may be a monocrystal, a polycrystal, or an amorphous material.

The substrate 10 includes a diaphragm 11, a pressure chamber 12 and a discharge nozzle 13.

The diaphragm 11 is a thin plate configured to support the piezoelectric/electrostrictive element 20. The diaphragm 11 vibrates (displaces) in the thickness direction in response to expansion and contraction of the piezoelectric/electrostrictive element 20. The pressure chamber 12 is a cavity provided below the diaphragm 11. The pressure chamber 12 retains ink injected from an ink guide port (not illustrated). The discharge nozzle 13 extends downwardly from the pressure chamber 12. The ink retained in the pressure chamber 12 is discharged from the discharge nozzle 13 in response to the vibration of the diaphragm 11.

2. Piezoelectric/Electrostrictive Element 20

The piezoelectric/electrostrictive element 20 extends in the length direction on the substrate 10. A plurality of piezoelectric/electrostrictive elements 20 is mutually aligned in parallel.

The piezoelectric/electrostrictive element 20 includes a lower electrode 21, a piezoelectric body 22, an upper electrode 23, and a glass layer 24. In the embodiments, the upper electrode 23 is an example of "a first electrode" and the lower electrode 21 is an example of "a second electrode".

2-1 Lower Electrode 21

The lower electrode 21 is a thin film-shaped fired body that is disposed on the diaphragm 11. When viewed in plan, the lower electrode 21 is formed with a size that is smaller than the size of the diaphragm 11. The length of the lower electrode 21 is for example 500 microns to 5000 microns. The width of the lower electrode 21 is for example 30 microns to 500 microns. The thickness of the lower electrode 21 is for example 0.1 microns to 10.0 microns.

The lower electrode 21 is configured from an acid resistant conductive material. The conductive material includes for example noble metals such as platinum (Pt) or the like, in addition to conductive polymers and conductive oxides.

2-2 Piezoelectric Body 22

The piezoelectric body 22 is a thin film-shaped fired body disposed on the lower electrode 21. The piezoelectric body 22 includes a first main surface 22S, a second main surface 22T, and a side surface 22U. The upper electrode 23 is disposed on the first main surface 22S. The lower electrode 21 is disposed on the second main surface 22T. When a voltage is applied to the lower electrode 21 and the upper electrode 23, the piezoelectric body 22 contracts and expands in a direction that is perpendicular to the thickness direction. The diaphragm 11 vibrates (displaces) in the thickness direction in response to the contraction or expansion of the piezoelectric body 22. The side surface 22U is connected to the first main surface 22S and the second main surface 22T. There is no requirement that the side surface 22U has a perpendicular configuration with respect to the first main surface 22S and the second main surface 22T.

In plan view, the piezoelectric body 22 is formed with a size that is smaller than or equal to the size of the lower electrode 21. The length of the piezoelectric body 22 is for example 500 microns to 5000 microns. The width of the piezoelectric body 22 is for example 30 microns to 500 microns. The thickness of the piezoelectric body 22 is for example 0.5 microns to 15.0 microns. The piezoelectric body 22 is formed with a size that is larger than the size of the upper electrode 23. As a result, the external edge portion of the first main surface 22S of the piezoelectric body 22 is exposed from the upper electrode 23.

The piezoelectric body 22 is configured from a polycrystal piezoelectric material. The piezoelectric material includes for example lead titanate zirconate (PZT), or the like.

2-3 Upper Electrode 23

The upper electrode 23 is a thin film-shaped fired body disposed on the piezoelectric body 22. The upper electrode 23 includes an electrode side surface 23S and an electrode upper surface 23T. The electrode side surface 23S is connected to the first main surface 22S of the piezoelectric body 22. The electrode side surface 23S may not be perpendicular with respect to the first main surface 22S, and may be inclined with respect to the first main surface 22S. The electrode upper surface 23T is connected to the electrode side surface 23S. The electrode upper surface 23T may not be perpendicular with respect to the electrode side surface 23S, and may be inclined with respect to the electrode side surface 23S.

In plan view, the upper electrode 23 is formed with a size that is smaller than the size of the piezoelectric body 22. The length of the upper electrode 23 is for example 498 microns to 4998 microns. The width of the upper electrode 23 is for example 28 microns to 498 microns. The thickness of the upper electrode 23 is for example 0.01 microns to 10.0 microns.

The upper electrode 23 is configured from an acid resistant conductive material. The conductive material includes noble metals such as gold (Au), silver (Ag), platinum (Pt), or copper (Cu), or an alloy formed from such noble metals. However, the conductive material that configures the upper electrode 23 is not limited to a noble metal, and includes a conductive polymer or a conductive oxide. Furthermore, a material other than a conductive material may be added to the upper electrode 23. For example, as disclosed below, when the glass layer is formed by use of an etching method, the conductive material may include a trace amount of the glass material that configures the glass layer 24.

2-4 Glass Layer 24

The glass layer 24 is formed and connected with the electrode side surface 23S of the upper electrode 23 and the first main surface 22S of the piezoelectric body 22. However, the glass layer 24 is not formed on the side surface 22U of the piezoelectric body 22, and is isolated from the side surface 22U.

As illustrated in FIG. 3, the glass layer 24 includes a bonding portion 241, a first extending portion 242, and a second extending portion 243.

The bonding portion 241 is formed to cover the boundary P of the electrode side surface 23S and the first main surface 22S. The bonding portion 241 is continuously formed on the first main surface 22S and the electrode side surface 23S. The upper electrode 23 is bonded onto the piezoelectric body 22 by the connection formed by the bonding portion 241 between the first main surface 22S and the electrode side surface 23S. In this manner, the outer edge of the upper electrode 23 can be inhibited from peeling from the piezoelectric body 22.

The first extending portion 242 is connected with the bonding portion 241 and extends onto the first main surface 22S. The first extending portion 242 extends only onto the first main surface 22S, and is not formed on the side surface 22U of the piezoelectric body 22. The second extending portion 243 is connected with the bonding portion 241 and extends onto the electrode side surface 23S. The second extending portion 243 extends only onto the electrode side surface 23S, and is not formed on the electrode upper surface 23T.

The glass layer 24 contains at least one main component selected from the group consisting of bismuth oxide, boron oxide, silicon oxide, zinc oxide, aluminum oxide, phosphorus oxide, calcium oxide and titanium oxide. In the embodiments, a composition X in which a substance Y is "contained as a main component" means that the material Y relative to the whole of the composition X is preferably at least 60 wt %, more preferably at least 70 wt %, and still more preferably at least 90 wt %.

The glass layer 24 may be formed as a uniform layer, but also may be formed in a net-like structure. When the glass layer is formed in a layer structure, the strength of the glass layer 24 itself can be enhanced. On the other hand, when the glass layer 24 is formed in a net-like structure, the effect on the expansion and contraction (displacement) of the piezoelectric body 22 can be reduced. A portion of the glass layer 24 may be formed in a layer structure, and the residual portion may be formed in a net-like structure.

The thickness of the glass layer 24 may be for example 1 nm to 10 microns. The thickness of the glass layer 24 is preferably less than the thickness of the upper electrode 23. More specifically, the thickness of the glass layer 24 is preferably less than or equal to 30% of the thickness of the upper electrode 23. This is due to the fact that the effect of the rigidity of the glass layer 24 on the displacement of the diaphragm 11 is conspicuously reduced.

Method for Manufacturing Actuator 100

Next, the method for manufacturing the actuator 100 will be described making reference to the figures.

Figure 4A:
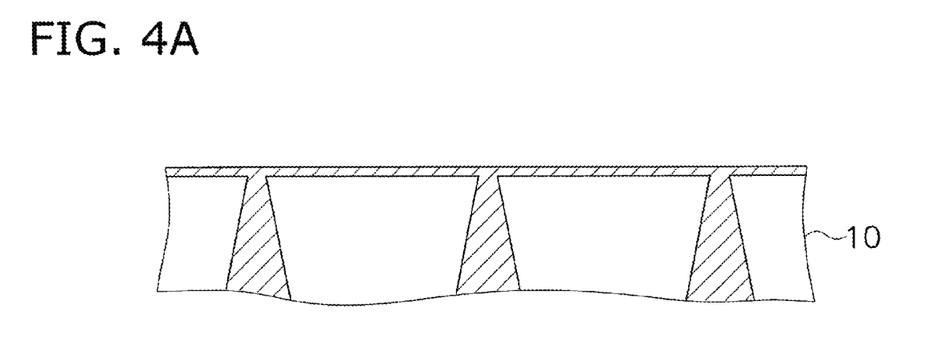
FIG. 4A, FIG. 4B and FIG. 4C illustrate a method for manufacturing the actuator.

Firstly, a laminated body is prepared by laminating a plurality of green sheets that is configured by the insulating material used in the substrate 10. Each green sheets is punched into a predetermined pattern. The inner portion of the laminated body is formed into a cavity corresponding to the pressure chamber 12, the discharge nozzle 13.

Next, as illustrated in FIG. 4A, the substrate 10 is prepared by firing of the laminated body.

Then, a spin coat method or the like is used to coat a photoresist (negative resist) onto the substrate 10 and thereby form a photoresist film.

Then, the photoresist film is patterned by use of photolithography into a shape that corresponds to the lower electrode 21.

Then, a spray coat method or the like is used to coat a catalytic solution containing palladium for example onto openings of the photoresist film.

Figure 4B:
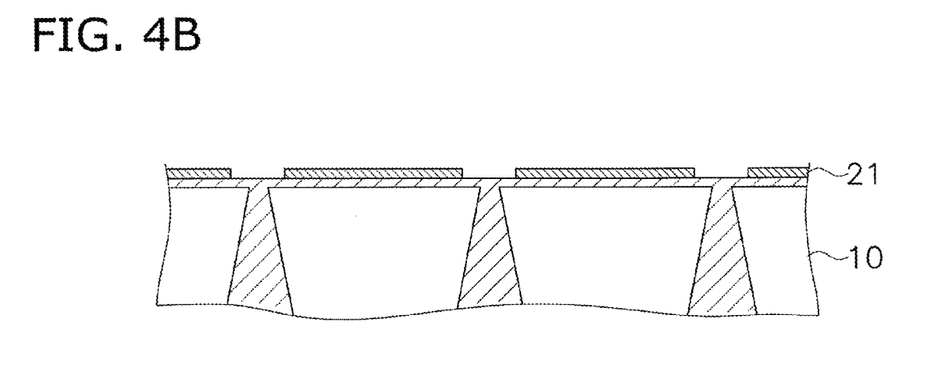

Next, as illustrated in FIG. 4B, after removing the photoresist film, an electroplating method or the like is used to form the lower electrode 21 as a ground for the catalyst.

Figure 4C:
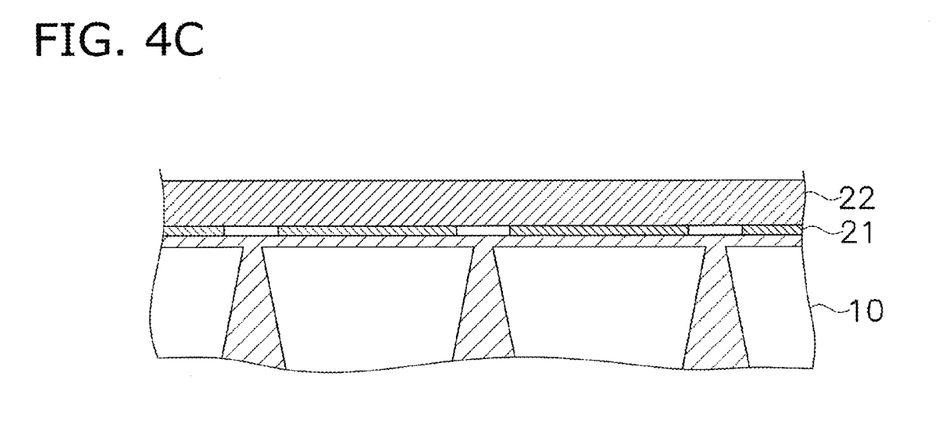

Next, a green sheet for the piezoelectric body 22 is disposed on the lower electrode 21. In addition to a piezoelectric material powder, the green sheet for the piezoelectric body 22 may contain $Pb_3O_4$ powder or $Bi_2O_3$ powder as a sintering auxiliary, a dispersing agent, an organic binder, or the like.

Then, as illustrated in FIG. 4C, the green sheet for the piezoelectric body 22 is fired under predetermined conditions (firing temperature 800 degrees C. to 1200 degrees C., firing time 0.5 h to 5.0 h) to form the piezoelectric body 22. However, as used herein, the piezoelectric body 22 is formed as a single large film-shaped body.

Figure 5A:
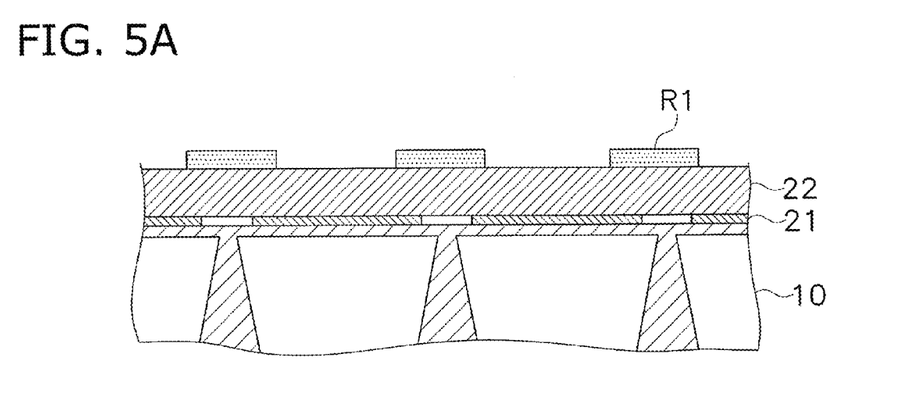
FIG. 5A, FIG. 5B and FIG. 5C illustrate a method for manufacturing the actuator.

Then, a spin coat method or the like is used to coat a photoresist (negative resist) onto the piezoelectric body 22 and thereby form a photoresist film R1.

Then, as illustrated in FIG. 5A, the photoresist film R1 is patterned by use of photolithography into a shape that corresponds to the upper electrode 23.

Figure 5B:
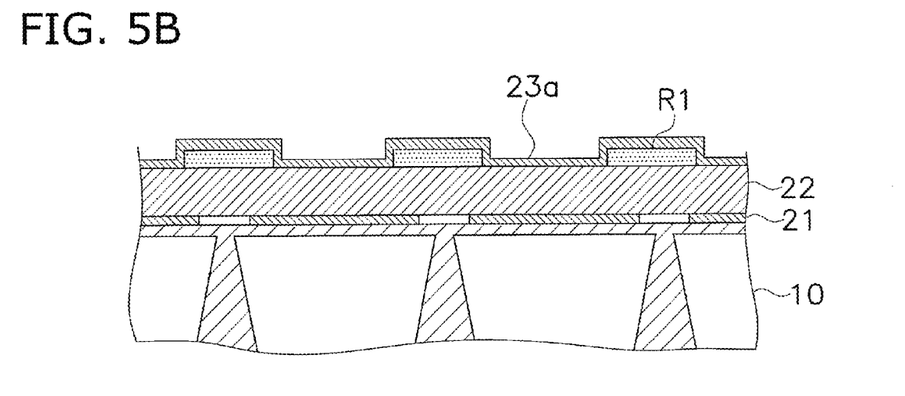

Then, as illustrated in FIG. 5B, a spin coat method or the like is used to coat a resinate paste 23a that contains a conductive material for use in the upper electrode 23 onto the patterned photoresist film R1. In the present embodiment, the resinate paste 23a for use in the upper electrode 23 includes a mixture of the glass material for use in the glass layer 24 in addition to organic metallic compounds for use in the upper electrode 23.

Figure 5C:
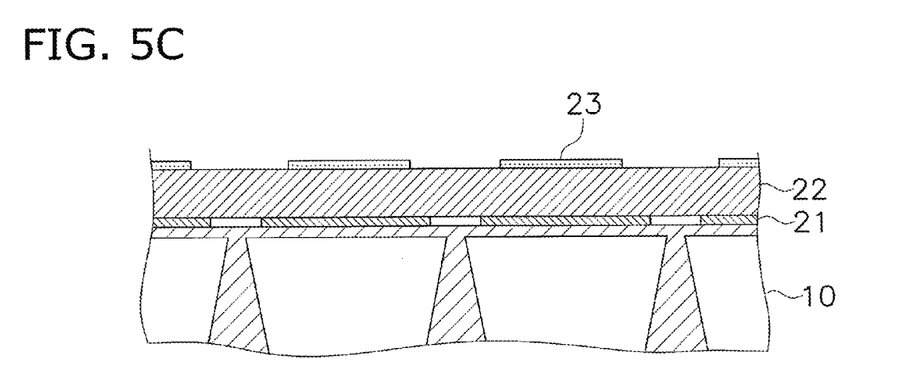

Next, as illustrated in FIG. 5C, after removing the photoresist film R1, the resinate paste 23a for use in the upper electrode 23 is fired under predetermined conditions (firing temperature 400 degrees C. to 1000 degrees C., firing time 1 min to 2 h) to form the upper electrode 23.

Then, a spin coat method or the like is used to coat a photoresist (positive resist) onto the upper electrode 23 and thereby form a photoresist film R2.

Figure 6A:
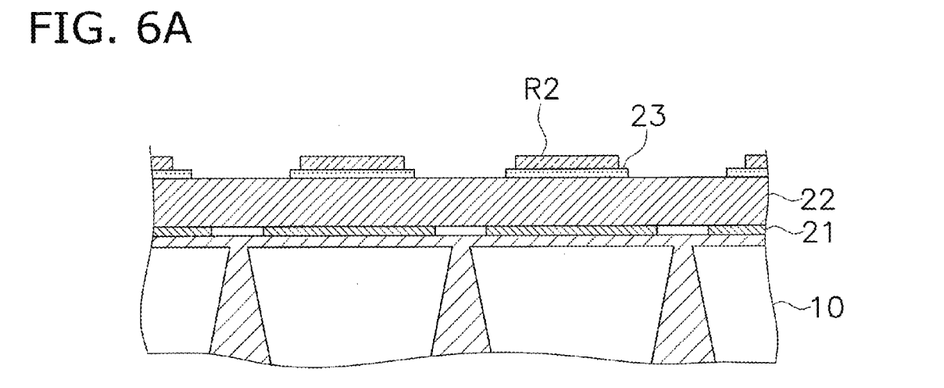
FIG. 6A, FIG. 6B and FIG. 6C illustrate a method for manufacturing the actuator.

Then, as illustrated in FIG. 6A, the photoresist film R2 is patterned by use of photolithography into a shape that corresponds to the glass layer 24. That is to say, the outer periphery of the photoresist film R2 is removed to form a lower size, and thereby expose the outer edge of the upper electrode 23.

Figure 6B:
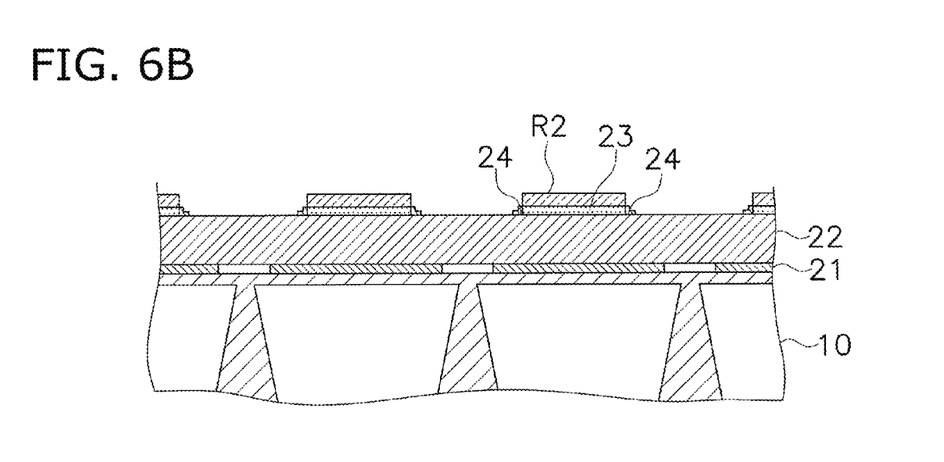

Next as illustrated in FIG. 6B, the outer edge of the upper electrode 23 is etched using an etching liquid for the conductive material of the upper electrode 23. In this manner, the glass layer 24 is formed since only the glass material mixed into the upper electrode 23 remains. The glass layer 24 is formed in a layered shape when the mixing amount of the glass material that is mixed into the resinate paste 23a for the upper electrode 23 is high. The glass layer 24 is formed in a net-like structure when the mixing amount of the glass material mixed into the resinate paste 23a for the upper electrode 23 is low, formation is possible into a net-like structure.

Then, a spin coat method or the like is used to coat a photoresist (positive resist) onto the piezoelectric body 22 and thereby form a photoresist film R3.

Figure 6C:
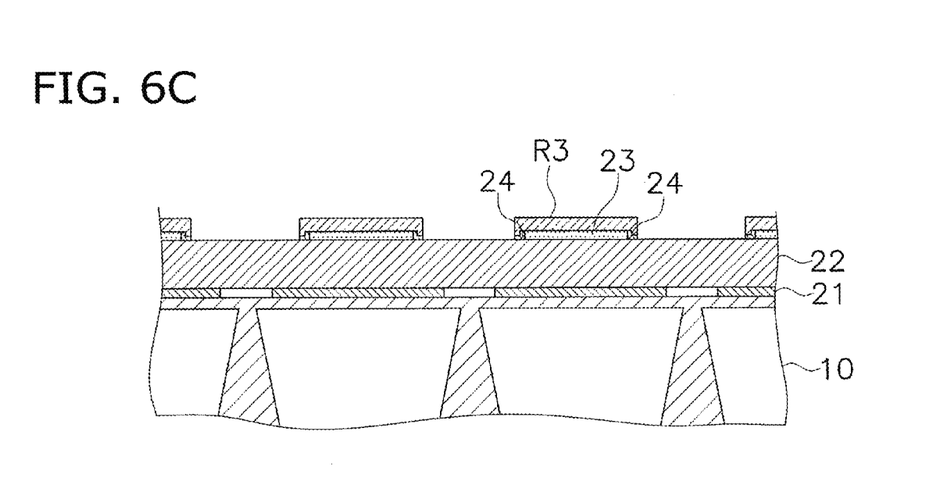

Then, as illustrated in FIG. 6C, the photoresist film R3 is patterned by use of photolithography to cover the upper electrode 23 and the glass layer 24.

Next, the piezoelectric body 22 is etched by an etching liquid for use in relation to a piezoelectric material to thereby pattern the piezoelectric body 22 as illustrated in FIG. 2. The etching liquid may be a mixed liquid of an acidic aqueous solution (for example, 10% concentration of diluted hydrochloric acid), trace amounts of ammonium fluoride, a thickening agent, a complexing agent, a surface active agent, or the like.

In this manner, the actuator 100 is completed.

Operation and Effect

The glass layer 24 is continuously formed on the electrode side surface 23S of the upper electrode 23 and the first main surface 22S of the piezoelectric body 22. Therefore, since the upper electrode 23 can be bonded to the piezoelectric body 22 by the glass layer 24, peeling of the upper electrode 23 from the piezoelectric body 22 can be inhibited.

The glass layer 24 is isolated from the side surface 23S of the piezoelectric body 22. Therefore, it is possible to suppress hindrance by the glass layer 24 of the expansion and contraction (displacement) of the piezoelectric body 22 in the thickness direction.

As described above, the piezoelectric/electrostrictive element 20 according to the present embodiment enables inhibition of a reduction in the displacement of the piezoelectric body 22 while inhibiting peeling of the upper electrode 23.

Other Embodiments

The present invention is not limited to the above embodiments, and includes various modifications or variations within a scope that does not depart from the scope of the present invention.

(A) In the above embodiment, the glass layer 24 is configured to include the bonding portion 241, the first extending portion 242 and the second extending portion 243. However there is no limitation in this regard, and it is sufficient if the glass layer 24 includes the bonding layer 241, and the first extending portion 242 and the second extending portion 243 need not be included.

(B) In the above embodiment, the outer edge portion of the upper electrode 23 is etched to form the glass layer 24 as a result of residual glass material. However, there is no limitation in this regard, and after forming the upper electrode 23 with one smaller size on the piezoelectric body 22, the glass layer 24 may be formed by coating a glass material along the boundary P (see FIG. 3). Furthermore, a known method other than a coating method (for example, a printing method, a dip method, or the like) may be used in order to form the glass layer 24 on the outer periphery of the upper electrode 23. However, as described in the above embodiment, the use of an etching method enables low cost and accurate formation of a thin glass layer 24.

(C) Although there was no specific disclosure in the above embodiment, the piezoelectric/electrostrictive element 20 may include a glass layer formed and connected to the electrode side surface of the lower electrode 21 and the second main surface 22T of the piezoelectric body 22. This type of glass layer may be prepared by forming the lower electrode 21 in the same manner as the upper electrode 23 in the above embodiment. This type of glass layer inhibits a reduction in the displacement of the piezoelectric body 22 while inhibiting peeling of the lower electrode 21.

EXAMPLES

The examples of the present invention will be described below. However, the present invention is not limited to the examples described below.

In the following description, piezoelectric/electrostrictive elements were prepared as Samples No. 1 to 3, and inkjet head actuators were prepared as Samples No. 4 to 6.

FIG. 7 to FIG. 12 are schematic sectional views of Samples No. 1 to 6. As illustrated in FIG. 7 to FIG. 12, the element of Sample No. 1 is applied to the actuator of Sample No. 4, the element of Sample No. 2 is applied to the actuator of Sample No. 5, and the element of Sample No. 3 is applied to the actuator of Sample No. 6.

Sample No. 1

The piezoelectric/electrostrictive element in Sample No. 1 was prepared as described below.

Firstly, a green sheet was prepared by forming a slurry containing a plasticizing agent, a dispersing agent, an organic binder and a piezoelectric powder formed from a PZT+Pb $(Ni_{1/3}Nb_{2/3})O_3$ composition.

Next, the green sheet was fired for three hours at 1100 degrees C. to thereby prepare a piezoelectric body (length 1.35 mm, width 1 mm, and thickness 0.13 mm).

Next, a spin coater was used coat a resinate paste containing 2 wt % of a glass component (bismuth oxide:boron oxide:silicon oxide=5:60:3) relative to Au onto the whole surface of both main surfaces of the piezoelectric body.

Next, the Au resinate (organic metallic compound) paste was fired for 0.5 hours at 600 degrees C. to thereby prepare a pair of electrodes (thickness 1 micron).

Then, a spray coater was used to coat a positive resist liquid (manufactured by Tokyo Ohka Kogyo (Co., Ltd.)) onto each electrode, and dried.

Then a glass mask was used to expose the resist film and thereby form a protective film. At this time, the protective film was patterned so that the outer edge of each electrode was exposed from the protective film.

Figure 7:
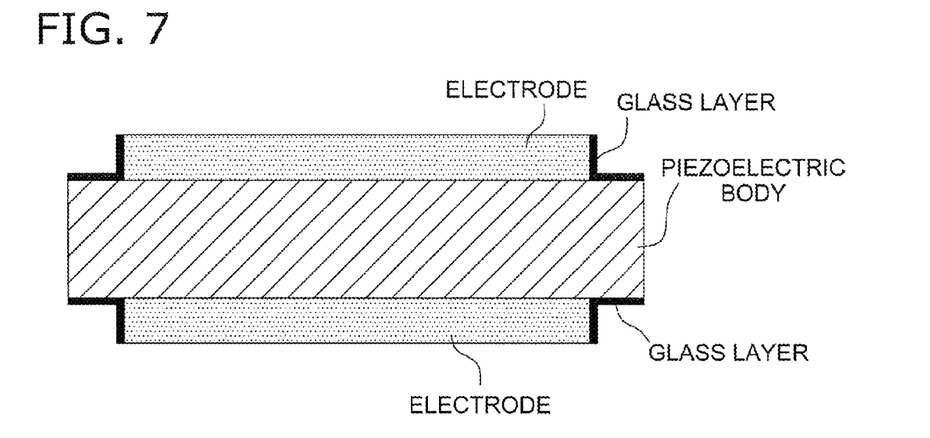
FIG. 7 illustrates a sectional view of a Sample No. 1.

Next, an Au etching liquid was used to etch the outer edge of each electrode that was exposed from the protective film. In this manner, as illustrated in FIG. 7, a glass layer was formed that is connected from the main surface of the piezoelectric body to the side surface of the electrode. Consequently, each electrode is formed at one smaller size by the etching (length 1.34 mm, width 0.99 mm, thickness 1 micron).

Figure 13:
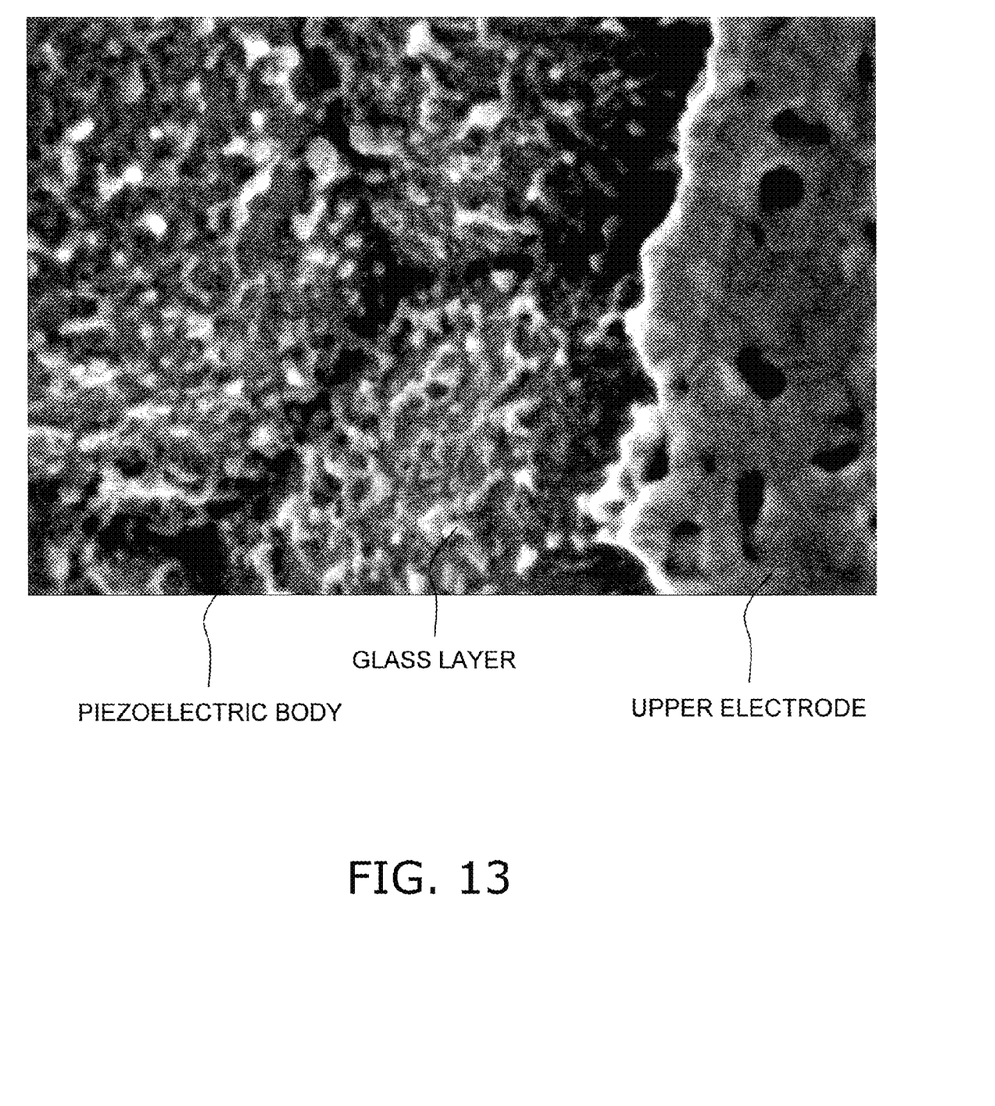
FIG. 13 illustrates a SEM image of the glass layer in Sample No. 1.

FIG. 13 is an SEM image illustrating the glass layer formed in Sample No. 1. FIG. 13 illustrates the glass layer formed on the piezoelectric body (that is to say, the portion corresponding to the first extending portion 242 illustrated in FIG. 3). As illustrated in FIG. 13, the formation of a glass layer in a net-like structure was confirmed in relation to Sample No. 1. The thickness of the glass layer is 300 nm.

The SEM image illustrated in FIG. 13 was acquired by use of a scanning electron microscope (acceleration voltage 1 kV).

Sample No. 2

Figure 8:
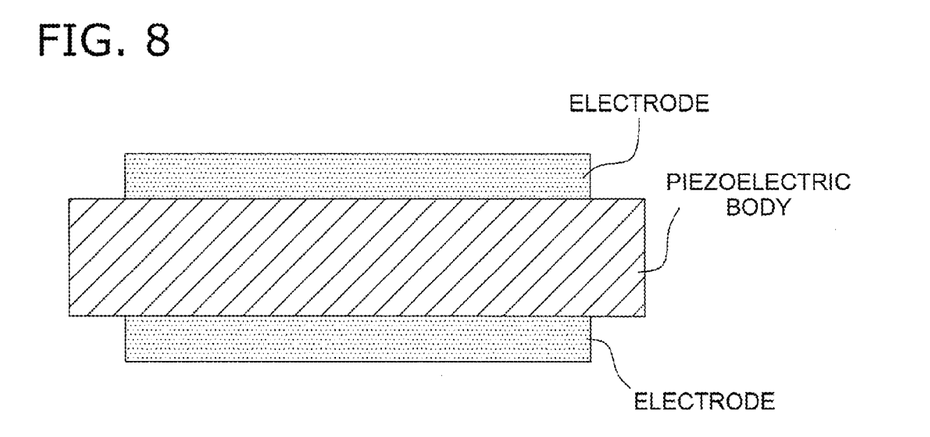
FIG. 8 illustrates a sectional view of a Sample No. 2.

The piezoelectric/electrostrictive element in Sample No. 2 was prepared as described below. The point of difference from Sample No. 1 is that the glass layer was not formed as illustrated in FIG. 8.

Firstly, the piezoelectric body was prepared in the same manner as Sample No. 1.

Then screen printing is used to coat an Au resinate paste onto both main surfaces of the piezoelectric body.

Next, the Au resinate paste was fired for 0.5 hours at 600 degrees C. to prepare a pair of electrodes. The size of each electrode was the same as the size of Sample No. 1 (length 1.34 mm, width 0.99 mm, thickness 1 micron).

Sample No. 3

Figure 9:
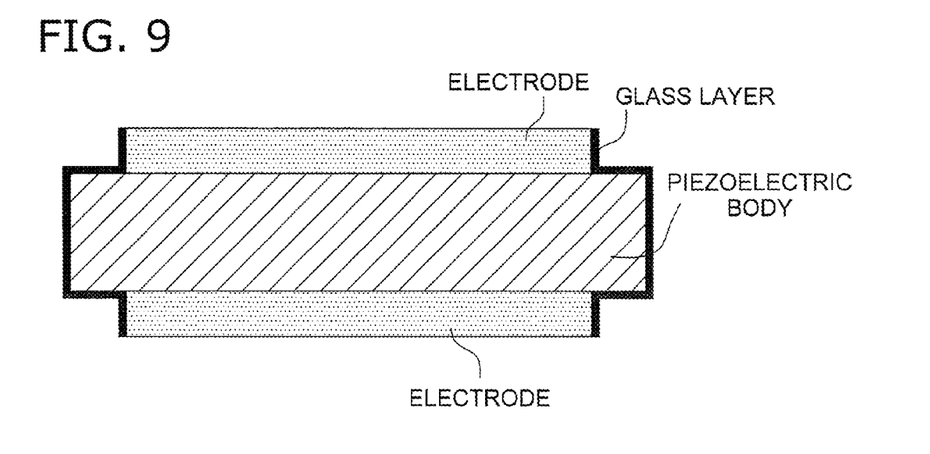
FIG. 9 illustrates a sectional view of a Sample No. 3.

The piezoelectric/electrostrictive element in Sample No. 3 was prepared as described below. The point of difference from Sample No. 1 is that the glass layer was also formed on the side surface of the piezoelectric body as illustrated in FIG. 9.

Firstly, the piezoelectric body was prepared in the same manner as Sample No. 1.

Then a spray coater was used to coat an Au resinate paste containing the same glass components as Sample No. 1 onto the whole surface of the piezoelectric body.

Next, the Au resinate paste was fired for 0.5 hours at 600 degrees C. to prepare a fired body for the upper electrode material and thereby enclose the whole of the piezoelectric body.

Then, a spray coater was used to coat a positive resist liquid (manufactured by Tokyo Ohka Kogyo (Co., Ltd.)) onto the same region as Sample No. 1, and dried.

Then a glass mask was used to expose the resist film and thereby form a protective film that was the same as Sample No. 1.

Next, an Au etching liquid was used to etch the fired body of the upper electrode material. In this manner, as illustrated in FIG. 9, a glass layer (thickness 300 nm) was formed not only on the side surface of each electrode and the main surface of the piezoelectric body, but also to cover the whole side surface of the piezoelectric body. That is to say the glass layer was formed to cover the whole of the electrode and the piezoelectric body. The pair of electrodes was of the same size as Sample No. 1 (length 1.34 mm, width 0.99 mm, thickness 1 micron).

Sample No. 4

An actuator for an inkjet head of Sample No. 4 was prepared as described below.

Firstly, a plurality of green sheets formed by partially stabilized zirconia slurry was laminated to thereby prepare a laminated body of 250 microns thickness. Each green sheets was punched into a predetermined pattern to thereby form a cavity (length 1 mm, width 80 microns, depth 60 microns) corresponding to the pressure chamber, and a through hole corresponding to the discharge nozzle in the inner portion of the laminated body.

Next, the substrate is prepared by firing of the laminated body for 2 hours at 1450 degrees C.

Then, a spray coater was used to coat a negative photoresist liquid onto the surface of the substrate and dried to thereby form a resist film.

Then, an exposure apparatus (multilight manufactured by Ushio (Inc.)) and a glass mask were used to pattern the resist film.

Then, a spray coater was used to coat a catalytic solution containing palladium onto the opening of the photoresist film.

Next, after removing the photoresist film, platinum non-electrolytic plating was used to form the lower electrode (width 80 microns, thickness 1 micron).

Next, a slurry containing a plasticizer, a dispersing agent, an organic binder, $Pb_3O_4$ powder or $Bi_2O_3$ powder as a sintering auxiliary, and a piezoelectric powder formed from a PZT+Pb $(Ni_{1/3}Nb_{2/3})O_3$ composition was formed to prepare a green sheet.

Then, the green sheet was adhered onto the lower electrode in a vacuum chamber and a degreasing process was performed.

Next, the green sheet was fired for two hours at 1000 degrees C. to thereby prepare a single film-shaped piezoelectric body (thickness 3 microns).

Next, after patterning the resist film in the same manner as the forming process of the lower electrode, a spray coater was used to coat a resinate paste containing 2 wt % of a glass component (bismuth oxide:boron oxide:silicon oxide=5:60:3) relative to Au onto the piezoelectric body.

Next, the Au resinate paste was fired for 0.5 hours at 600 degrees C. to thereby prepare the upper electrode (width 75 microns, thickness 0.1 micron).

Then, a spray coater was used to coat a positive resist liquid (manufactured by Tokyo Ohka Kogyo (Co., Ltd.)) onto the upper electrode, and dried.

Then a glass mask was used to expose the resist film and thereby form a protective film. At this time, the protective film was patterned so that the outer edge of the upper electrode is exposed from the protective film.

Figure 10:
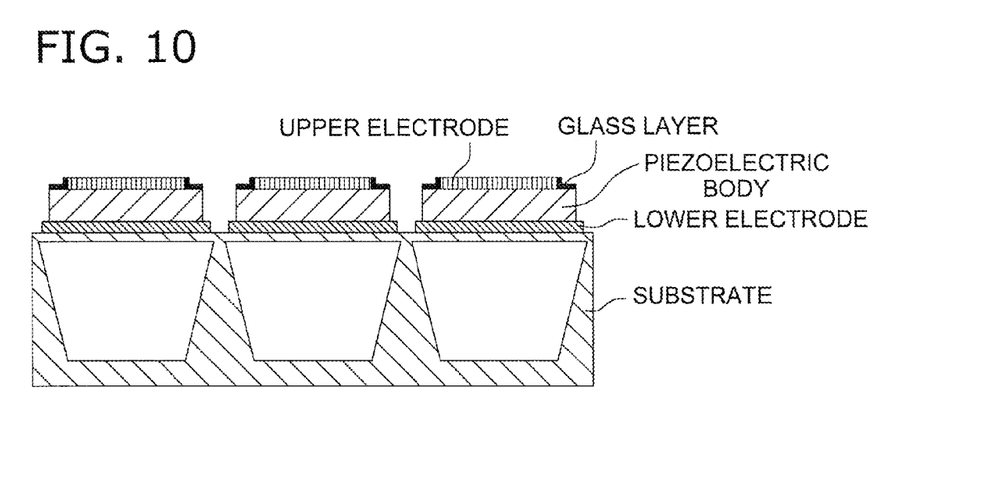
FIG. 10 illustrates a sectional view of a Sample No. 4.

Next, an Au etching liquid was used to etch the outer edge of the upper electrode that is exposed from the protective film. In this manner, as illustrated in FIG. 10, a glass layer (thickness 30 nm) was continuously formed on the main surface of the piezoelectric body and the side surface of the upper electrode. Consequently, the upper electrode is formed at a smaller size (width 65 microns).

Then, a spray coater was used to coat a positive resist liquid (manufactured by Tokyo Ohka Kogyo (Co., Ltd.)) onto the upper electrode, and dried.

Then a glass mask was used to expose the resist film and thereby form a protective film to cover the upper electrode and the glass layer.

Next, an etchant was prepared by adding trace amounts of ammonium fluoride, a thickening agent, a complexing agent, and a surface active agent to 10% concentration of diluted hydrochloric acid (fluorine concentration less than 1%).

Then, the etchant was sprayed for two minutes from a nozzle separated by 8 cm from the substrate to thereby etch the piezoelectric body. In this manner, the width of the piezoelectric body was configured to 75 microns. Thereafter, the piezoelectric body was washed in distilled water and dried at 110 degrees C.

Sample No. 5

Figure 11:
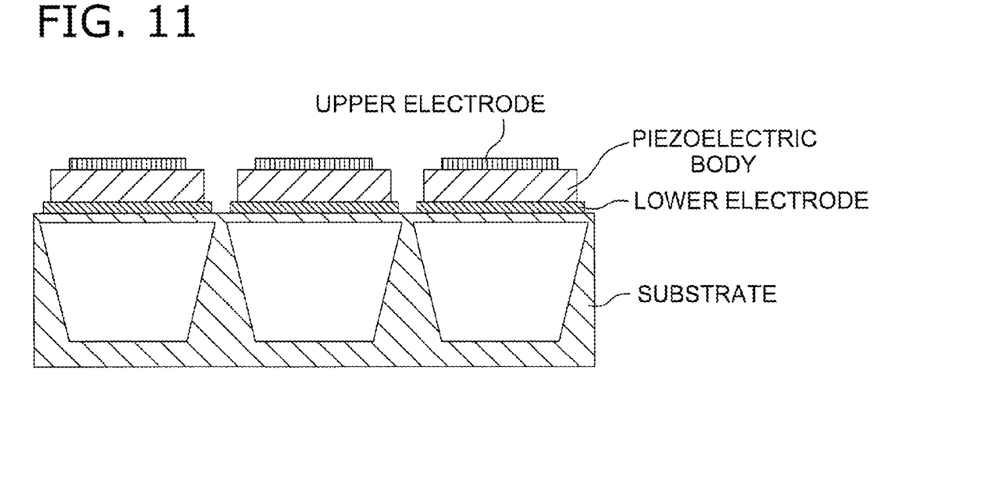
FIG. 11 illustrates a sectional view of a Sample No. 5.

An actuator for an inkjet head of Sample No. 5 was prepared as described below. The point of difference from Sample No. 4 is the point that the glass layer was not formed as illustrated in FIG. 11.

Firstly, a lower electrode and a piezoelectric body are prepared in the same manner as Sample No. 4.

Next, using screen printing, an Au resinate paste was coated onto the piezoelectric body.

Then the Au resinate paste was fired for 0.5 hours at 600 degrees C. to prepare an upper electrode (width 65 microns, thickness 0.1 microns).

Then, the piezoelectric body was etched in the same manner as Sample No. 4.

Sample No. 6

Figure 12:
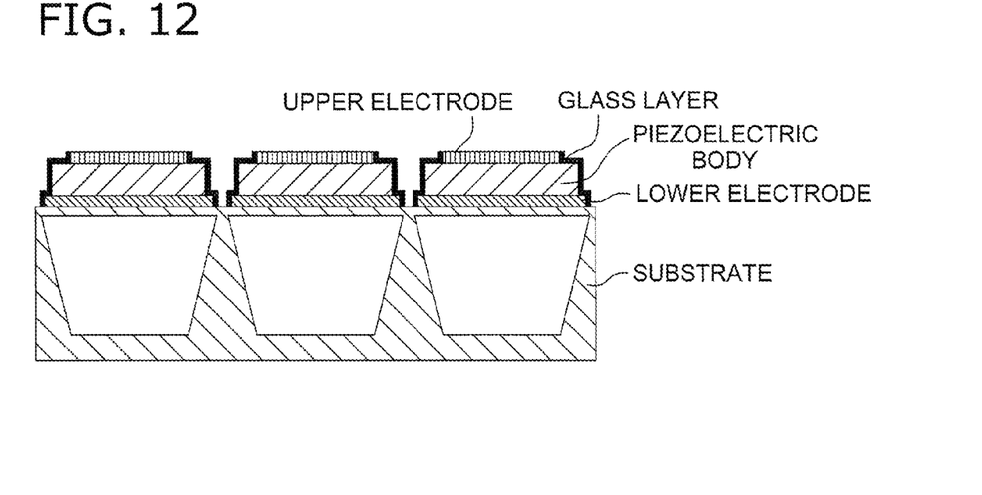
FIG. 12 illustrates a sectional view of a Sample No. 6.

An actuator for an inkjet head of Sample No. 6 was prepared as described below. The point of difference from Sample No. 4 is the point that the glass layer was also formed on the side surface of the piezoelectric body as illustrated in FIG. 12.

Firstly, a substrate, a lower electrode and a piezoelectric body were prepared in the same manner as Sample No. 4.

Next, a spray coater was used to coat a positive resist liquid (manufactured by Tokyo Ohka Kogyo (Co., Ltd.)) onto each electrode, and dried.

Then a glass mask was used to expose the resist film and thereby form a protective film. At this time, the protective film was patterned to cover the region in which the upper electrode and the glass layer were prepared.

Next, an etchant that was prepared by adding trace amounts of ammonium fluoride, a thickening agent, a complexing agent, and a surface active agent to 10% concentration of diluted hydrochloric acid (fluorine concentration less than 1%).

Then, the etchant was sprayed for two minutes from a nozzle separated by 8 cm from the substrate to thereby etch the piezoelectric body. In this manner, the width of the piezoelectric body was configured to 75 microns. Thereafter, the piezoelectric body was washed in distilled water and dried at 110 degrees C.

Next, a spray coater was used coat an Au resinate paste containing the same glass component as Sample No. 4 to cover the whole surface of the piezoelectric body and the lower electrode.

Next, the Au resinate paste was fired for 0.5 hours at 600 degrees C. to thereby prepare a fired body of the upper electrode material to cover the whole of the lower electrode and the piezoelectric body.

Then, a spray coater is used to coat a positive resist liquid (manufactured by Tokyo Ohka Kogyo (Co., Ltd.)) onto the region that forms the upper electrode, and dried.

Then a glass mask is used to expose the resist film and thereby form the same protective film as Sample No. 4.

Next, an Au etching liquid (manufactured by Tokyo Ohka Kogyo (Co., Ltd.)) was used to etch the fired body of the upper electrode material. In this manner, as illustrated in FIG. 12, a glass layer (thickness 30 nm) was formed not only on the side surface of the upper electrode and the main surface of the piezoelectric body, but also covers the whole side surface of the piezoelectric body. The pair of electrodes was the same size as those of Sample No. 4.

Electrode Bonding Strength

The bonding strength of the electrodes in Samples No. 1 to 6 was evaluated.

Firstly, polarization processing (temperature 60 degrees C., voltage corresponding to electric field of 10 kV/mm using direct current, voltage application time 10 sec) was performed in relation to the piezoelectric/electrostrictive elements of Samples No. 1 to 3. Thereafter, processing configured to switch the exposure environment of each sample respectively each hour between a high temperature (120 degrees C.) and a low temperature (−40 degrees C.) was repeated for five cycles. Then, the presence or absence of peeling of both electrodes was observed.

Next, polarization processing (temperature 75 degrees C., voltage corresponding to electric field of 15 kV/mm using direct current, voltage application time 10 sec) was performed in relation to the inkjet head actuators of Samples No. 4 to 6. Thereafter, an electrical field having a field intensity of 10 kV/mm, and a 1 kHz rectangular wave pattern was continuously applied for 67 hours to each sample, and the presence or absence of peeling of both electrodes was observed.

The observation results are shown in Table 1. In Table 1, a sample in relation to which electrode peeling was not confirmed is evaluated as ○, and a sample in relation to which electrode peeling was confirmed is evaluated as ×.

Displacement of Piezoelectric/Electrostrictive Element

The displacement of the piezoelectric/electrostrictive elements of Samples No. 1, 3, 4, and 6 was measured. In relation to Samples No. 2 and 5, the displacement was not measured since peeling of the electrode was observed in the bonding strength evaluation testing.

Firstly, polarization processing (temperature 60 degrees C., voltage corresponding to electric field of 10 kV/mm using direct current, voltage application time 10 sec) was performed in relation to the piezoelectric/electrostrictive elements of Samples No. 1 and 3. Thereafter, the displacement was measured by application to each sample of an electrical field having a 100 Hz rectangular wave pattern and a field intensity of 10 kV/mm. The displacement was measured by use of a laser Doppler displacement meter as the value given by the displacement in the thickness direction of the upper surface center of the piezoelectric/electrostrictive element. The measurement results are shown in Table 1.

Next, polarization processing (temperature 75 degrees C., voltage corresponding to electric field of 15 kV/mm using direct current, voltage application time 10 sec) was performed in relation to the inkjet head actuators of Samples No. 4 and 6. Thereafter, the displacement was measured by application to each sample of an electrical field having a 1 Hz triangular wave pattern and a field intensity of 10 kV/mm. The displacement was measured by use of a laser Doppler displacement meter as the value given by the displacement in the thickness direction of the upper surface center of the piezoelectric/electrostrictive element. The measurement results are shown in Table 1.

TABLE 1

| Sample No. | Bonding Strength Evaluation | Displacement (microns) |
| --- | --- | --- |
| 1 | ○ | 0.039 |
| 2 | × | — |
| 3 | ○ | 0.036 |
| 4 | ○ | 0.193 |
| 5 | × | — |
| 6 | ○ | 0.177 |

As illustrated in Table 1, in Samples No. 1, 3, 4, and 6, peeling of the electrode was not observed during the bonding strength evaluation testing. This effect is due to the enhancement of the bonding strength of the electrode resulting from the glass layer continuously formed on the main surface of the piezoelectric body and the side surface of the electrode.

Furthermore, a large displacement was observed in Sample No. 1 when compared with Sample No. 3. In the same manner, a large displacement was observed in Sample No. 4 when compared with Sample No. 6. This is due to the fact that in Sample No. 1 and 4, the lack of formation of the glass layer on the side surface of the piezoelectric body does not result in an impediment by the glass layer to the expansion and contraction of the piezoelectric body. Consequently, it was confirmed that it is preferred that a glass layer is not formed on the side surface of the piezoelectric body.

What is claimed is:

1. A piezoelectric/electrostrictive element comprising,
   a piezoelectric body formed in a thin film-shape, the piezoelectric body having a first main surface and a second main surface;
   a first electrode disposed on the first main surface of the piezoelectric body, the first electrode having an electrode upper surface and an electrode side surface configured to be connected with the first main surface;
   a second electrode disposed on the second main surface of the piezoelectric body;
   a glass layer continuously formed on the first main surface and the electrode side surface, the glass layer containing glass as a principal constituent; and
   the glass layer is isolated from a side surface of the piezoelectric body and the electrode upper surface.

2. The piezoelectric/electrostrictive element according to claim 1, wherein
   a thickness of the glass layer is smaller than a thickness of the first electrode.

3. The piezoelectric/electrostrictive element according to claim 1, wherein
   the glass layer is formed in a net structure.

4. The piezoelectric/electrostrictive element according to claim 2, wherein
   the glass layer is formed in a net structure.

5. A piezoelectric/electrostrictive element comprising,
   a piezoelectric body formed in a thin film-shape, the piezoelectric body having a first main surface and a second main surface;
   a first electrode disposed on the first main surface of the piezoelectric body, the first electrode having an electrode side surface configured to be connected with the first main surface;
   a second electrode disposed on the second main surface of the piezoelectric body;
   a glass layer continuously formed on the first main surface and the electrode side surface, the glass layer containing glass as a principal constituent; and the glass layer is isolated from a side surface of the piezoelectric body and a thickness of the glass layer is smaller than a thickness of the first electrode.

6. A piezoelectric/electrostrictive element comprising, a piezoelectric body formed in a thin film-shape, the piezoelectric body having a first main surface and a second main surface;

a first electrode disposed on the first main surface of the piezoelectric body, the first electrode having an electrode side surface configured to be connected with the first main surface;

a second electrode disposed on the second main surface of the piezoelectric body; and a glass layer continuously formed on the first main surface and the electrode side surface, the glass layer containing glass as a principal constituent and a thickness of the glass layer is smaller than a thickness of the first electrode.

* * * * *